US006566857B1

(12) United States Patent
Kakizawa et al.

(10) Patent No.: US 6,566,857 B1
(45) Date of Patent: May 20, 2003

(54) TESTING OF DIGITAL-TO-ANALOG CONVERTERS (75) Inventors: Akira Kakizawa, Phoenix, AZ (US); Carlos A. Ortega, Chandler, AZ (US); Mark A. Arellano, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/468,201

(22) Filed: Dec. 20, 1999

(51) Int. Cl.[7] ............................................... G01R 19/18
(52) U.S. Cl. ...................... 324/120; 341/120; 341/144
(58) Field of Search ............................ 324/158.1, 120, 324/121 R, 765; 341/120, 144; 358/189, 10

(56) References Cited

U.S. PATENT DOCUMENTS

| 4,495,462 | A | | 1/1985 | Weldon | |
|---|---|---|---|---|---|
| 4,538,266 | A | * | 8/1985 | Miki | 341/120 |
| 4,772,948 | A | * | 9/1988 | Irvin | 358/139 |
| 4,780,755 | A | * | 10/1988 | Knierim | 358/10 |
| 5,063,383 | A | * | 11/1991 | Bobba | 341/120 |
| 5,185,607 | A | * | 2/1993 | Lyon et al. | 341/120 |
| 5,583,502 | A | * | 12/1996 | Takeuchi et al. | 341/120 |
| 5,659,312 | A | | 8/1997 | Sunter et al. | |
| 5,886,657 | A | * | 3/1999 | Ahuja | 341/144 |
| 5,909,186 | A | * | 6/1999 | Gohringer | 341/120 |

* cited by examiner

*Primary Examiner*—Kamand Cuneo
*Assistant Examiner*—Jimmy Nguyen
(74) *Attorney, Agent, or Firm*—Fish & Richardson P.C.

(57) ABSTRACT

A technique for testing digital-to-analog converters includes providing a set of digital input signals to the digital-to-analog converters and comparing a resulting combined output signal from the digital-to-analog converters to a comparison value. A determination is made as to whether the resulting combined output signal is within a predetermined tolerance defined by the comparison value. An apparatus for testing digital-to-analog converters also is disclosed.

26 Claims, 7 Drawing Sheets

| SET OF DIGITAL INPUT SIGNALS | | EQUIVALENT DECIMAL VALUE INPUT TO RED DAC | EQUIVALENT DECIMAL VALUE INPUT TO GREEN DAC | TOTAL EXPECTED COMBINED CURRENT FROM BOTH DACs |
|---|---|---|---|---|
| DIGITAL INPUT TO RED DAC 14 | DIGITAL INPUT TO GREEN DAC 16 | | | |
| 1111 1111 | 0000 0000 | 255 | 0 | 18,666 uA |
| 1111 1110 | 0000 0001 | 254 | 1 | 18,666 uA |
| 1111 1101 | 0000 0010 | 253 | 2 | 18,666 uA |
| 1111 1100 | 0000 0011 | 252 | 3 | 18,666 uA |
| | | * * * | | |
| 0000 0011 | 1111 1100 | 3 | 252 | 18,666 uA |
| 0000 0010 | 1111 1101 | 2 | 253 | 18,666 uA |
| 0000 0001 | 1111 1110 | 1 | 254 | 18,666 uA |
| 0000 0000 | 1111 1111 | 0 | 255 | 18,666 uA |

TESTING OF DIGITAL-TO-ANALOG CONVERTERS

BACKGROUND OF THE INVENTION

This invention relates to the testing of digital-to-analog converters.

Digital-to-analog conversion refers to a process in which signals having a finite number of defined levels or states are converted into signals having a theoretically infinite number of levels or states. A circuit that performs that function is a digital-to-analog converter (DAC). A current output DAC produces a current output having a magnitude that typically is proportional to an n-bit digital word provided to the device, where n is a positive integer. The DAC can, therefore, be viewed as a digitally controlled current source in which the level of the current produced by the source is proportional to the digital word fed to the device.

The current output signal from the DAC typically is converted into a proportional voltage. In such a situation, the DAC does not operate as an ideal current source because of the DAC's internal impedance. As a result of the current through the internal impedance, the output current changes slightly from that defined by the digital word fed to the DAC. The change or variation in the desired output current as a function of output voltage is indicative of the compliance voltage range of the DAC. The compliance voltage range refers to the maximum range of output terminal voltage for which the DAC will provide a specified current output characteristic.

Frequently it is desirable to determine the compliance voltage range of a DAC. For example, the compliance voltage range can be measured and provided to users of the DAC so that they can determine whether the device is suitable for their particular applications.

When one or more DACs are incorporated into an electronic device or system, the DACs may be tested during the manufacture of the device or system. Preferably, the testing should be performed sufficiently quickly so that the testing does not significantly slow down the production process. At the same time, it is important that the testing provide a relatively high degree of accuracy over a wide range of input and output values.

SUMMARY OF THE INVENTION

In general, a technique for testing digital-to-analog converters includes providing a set of digital input signals to the digital-to-analog converters and comparing a resulting combined output signal from the digital-to-analog converters to a comparison value. A determination is made as to whether the resulting combined output signal is within a predetermined tolerance defined by the comparison value. An apparatus for testing digital-to-analog converters also is disclosed.

Various features and advantages will be readily apparent from the following detailed description, the accompanying drawings, and the claims.

BRIEF DESCRIPTION OF THE DRAWINGS

FIG. 6 is a flow chart showing steps of a method according to the invention.

DESCRIPTION OF THE PREFERRED EMBODIMENTS

Figure 1:
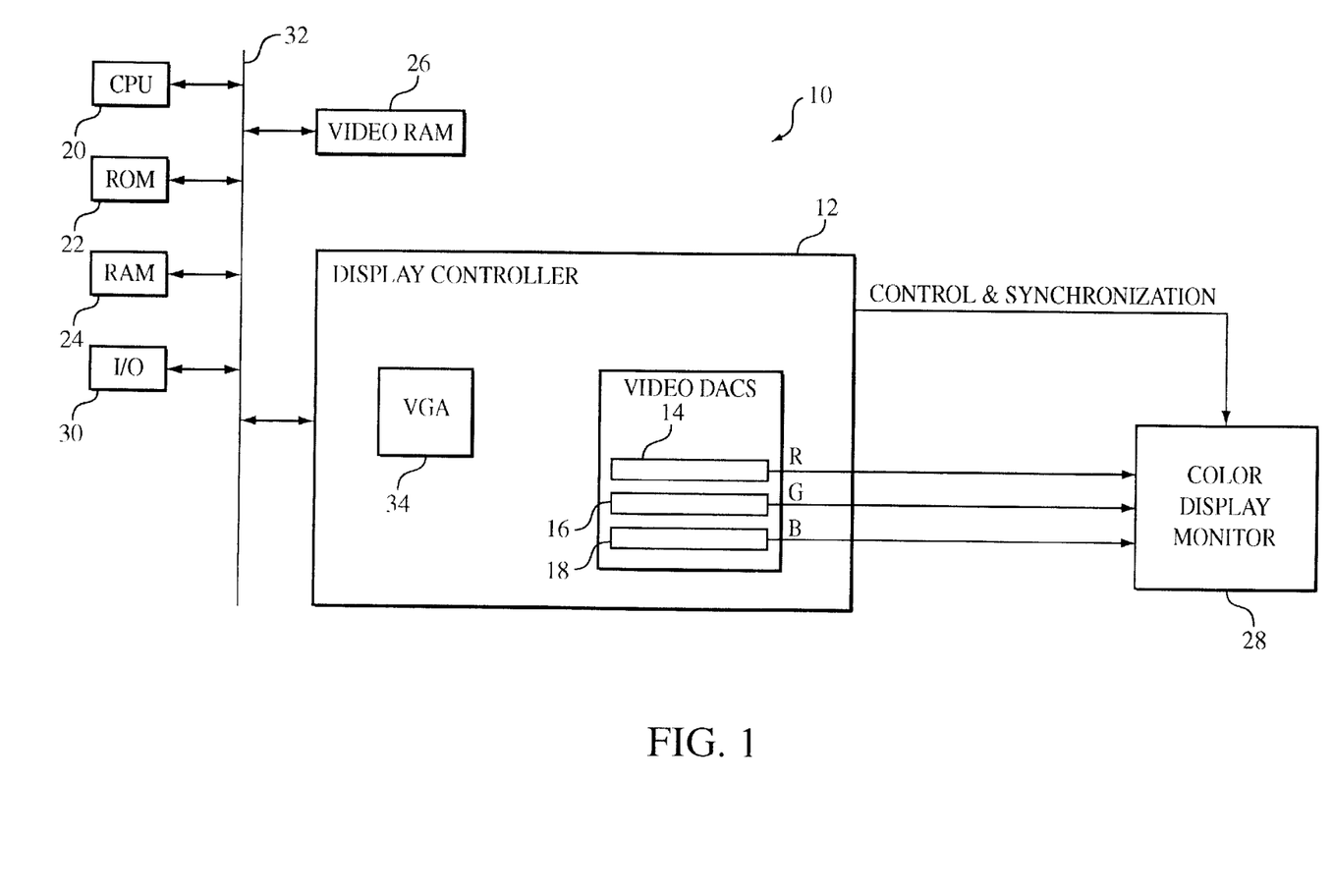
FIG. 1 is a block diagram of an exemplary computer system including a display controller with multiple DACs that can be tested according to the invention.

FIG. 1 illustrates an exemplary computer system 10 including a display controller 12 with multiple DACs 14, 16, 18 which can be tested using the techniques described in greater detail below. In addition to the display controller 12, the computer system may include a central processing unit (CPU) 20, read only memory (ROM) 22, random access memory (RAM) 24, a video RAM 26, a color display monitor 28 and input/output (I/O) ports 30 as well as other components. Some of the system components can be interconnected by a system bus 32.

The display controller 12 can be formed in a single semiconductor chip, and includes a graphic video subsystem 34, as well as the DACs 14, 16, 18. In the illustrated implementation, each of the DACs 14, 16, 18 has eight current sources (not shown) that generate currents with respective weights of 1, 2, 4, 8, 16, 32, 64, and 128. In one implementation, the smallest current source generates a current of about 73.2 micro-amperes (uA). In that case, when all the current sources in one of the DACs are turned on, a current of about 18,666 uA is generated at the output of the particular DAC.

The graphic video subsystem 34 can be a video graphic array (VGA) adapter for controlling the display monitor 28 based on image data stored in the video RAM 26. The graphic video subsystem 34 reads digital image data from the video RAM 26 and produces a series of pixel video data corresponding to the image data. The pixel video data is supplied to the DACs 14, 16, 18 which, in the illustrated implementation, have color registers each of which stores color data formed from the color values red (R), green (G) and blue (B). When a color register is selected by the pixel video data from the graphic subsystem 34, the DACs 14, 16, 18 convert the red, green and blue values of the color data stored in the selected color register into corresponding analog values. The analog values then can be provided to the display monitor 28.

Figure 2:
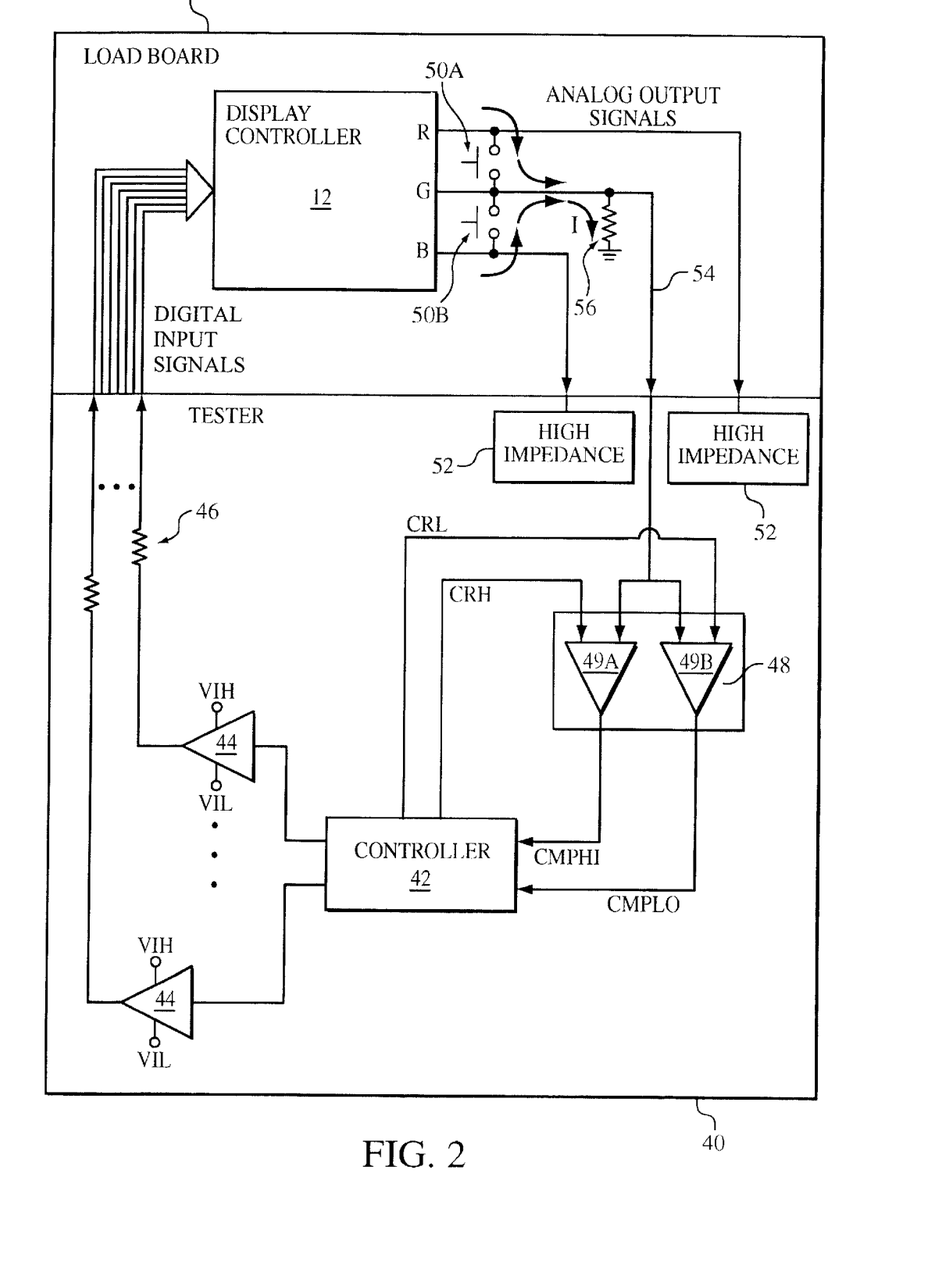
FIG. 2 illustrates a test apparatus for testing the DACs according to the invention.

To test the outputs of the DACs 14, 16, 18, the display controller chip 12 can be inserted into a test socket (not shown) on a load board 38 (FIG. 2). The load board 38 is coupled electrically to a digital tester 40 which provides digital input signals to the display controller 12 and which receives analog output signals from the display controller's DACs 14, 16, 18. The tester 40 determines whether the output signals from the DACs are within predetermined ranges. Such a determination can indicate whether the DACs 14, 16, 18 meet required pre-established manufacturing specifications.

The digital tester 40 includes a programmable controller 42 coupled to multiple drivers 44. The controller 42 can be implemented in hardware or software, or a combination of both. For example, it can be implemented in a computer program executable on a programmable computer. The program can be implemented in a high level procedural or object-oriented programming language to communicate with a computer system. The computer program can be stored on a storage medium, such as random access memory (RAM), readable by a general or special purpose programmable computer, for configuring and operating the computer when the storage medium is read by the computer to perform functions described below.

The controller 42 controls each driver 44 to provide either a digital high or digital low voltage signal (VIH or VIL) as an input to the display controller 12. A signal from one of the drivers 44 represents a single bit. Therefore, for each 8-bit DAC in the display controller 12, eight drivers 44 are used to provide the digital input bits. The controller 42 can change the value of each input bit dynamically. A resistor 46 can, be coupled at the output of each driver 44 to provide impedance matching with the display controller 12.

The digital tester 40 also includes a comparator circuit 48 which receives a combined analog signal from two or more of the DACs 14, 16, 18 (as explained below) and provides digital output signals indicative of whether the analog signal is higher or lower than two predetermined analog references values (CRL, CRH) whose values can be set by the controller 42. Digital output signals (CMPLO, CMPHI) are provided to the controller 42 which determines whether the DAC output signal falls within a predetermined range. The output signal CMPLO indicates whether the combined output signal from the DACs is higher or lower than the reference value CRL. Similarly, the output signal CMPHI indicates whether the combined output signal from the DACs is higher or lower than the reference value CRH. As described below, the DACs 14, 16, 18 can be tested sequentially with multiple sets of digital input values. If each of the corresponding output signals falls within the predetermined range, then a determination can be made that the DACs meet the required specifications.

As shown in FIG. 2, relays 50A, 50B are provided, for example, on the load board 38. Each relay can be selectively controlled to be in an open or a closed position. The relays can be controlled either manually or automatically using control signals from the controller 42. When the first relay 50A is closed, the outputs of one pair of DACs, for example the red and green DACs 14, 16, are coupled together electrically. Similarly, when the second relay SOB is closed, the outputs of a second pair of DACs, for example the green and blue DACs 16, 18, are coupled electrically together. If both relays 50A, 50B are closed, then the outputs from all three DACs 14, 16 and 18, are coupled together.

An electrical channel 54 couples the output of the one of the DACs, for example the green DAC 16, to respective inputs of each of two comparators 49A, 49B in the comparator circuit 48 on the tester 40. In some situations, electrical channels also may be present connecting the outputs of the red and blue DACs 14, 18 to the tester 40. In that case, high impedance (i.e., high Z) circuits 52 should be provided at the respective interfaces to the tester 40 so that substantially all the current that is output from the DACs 14, 16, 18 is directed along the channel 54 when the relays 50A, 50B are closed. The current signal on channel 54 can be converted to a corresponding voltage signal by providing a resistive element, such as a resistor 56, in parallel with the output of the DAC 16. In the illustrated implementation, the value of the resistor 56 is selected so that the maximum current signal 18,666 uA corresponds to a voltage of about 765 milli-volts (mV).

Figure 7:
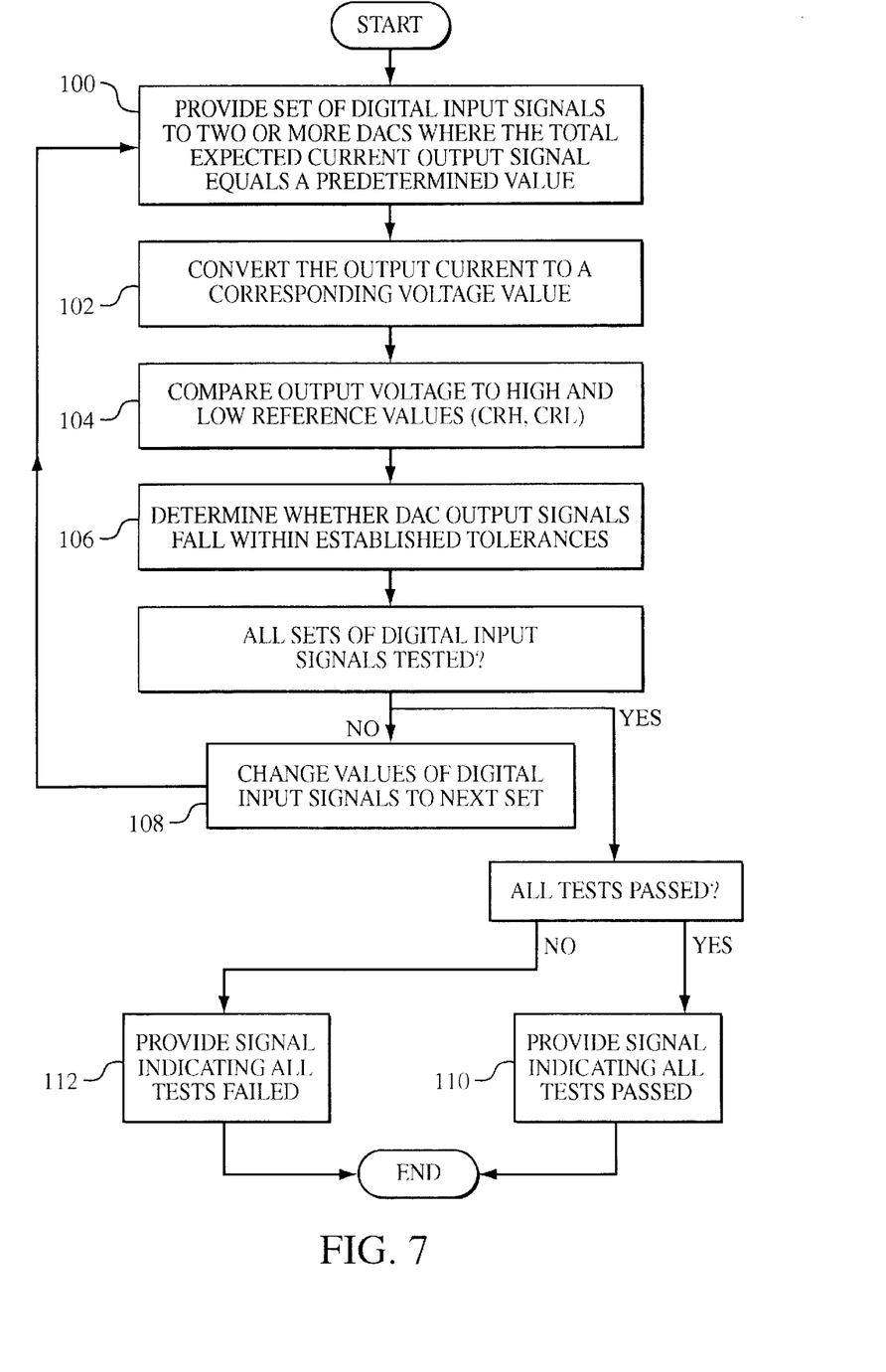

In operation, multiple sets of digital input signals are provided sequentially to two or more of the DACs 14, 16, 18 whose outputs are coupled electrically through the relay(s) 50A, 50B (see FIG. 7). Each set of digital input signals is selected so that the total expected current from the DACs whose outputs are tied together equals a predetermined value. After each set of digital input signals is provided to the DACs (step 100), the combined output current from the DACs is converted to a corresponding voltage signal (step 102). The voltage signal is compared to the high and low reference voltages, CRH, CRL, (step 104), and based on the comparisons, the controller 42 determines whether the DAC output signals fall within established tolerances (step 106). Preferably, all combinations of digital input signals that are expected to result in a combined output current equal to the predetermined level are included among the sets of digital input signals.

Figure 3:
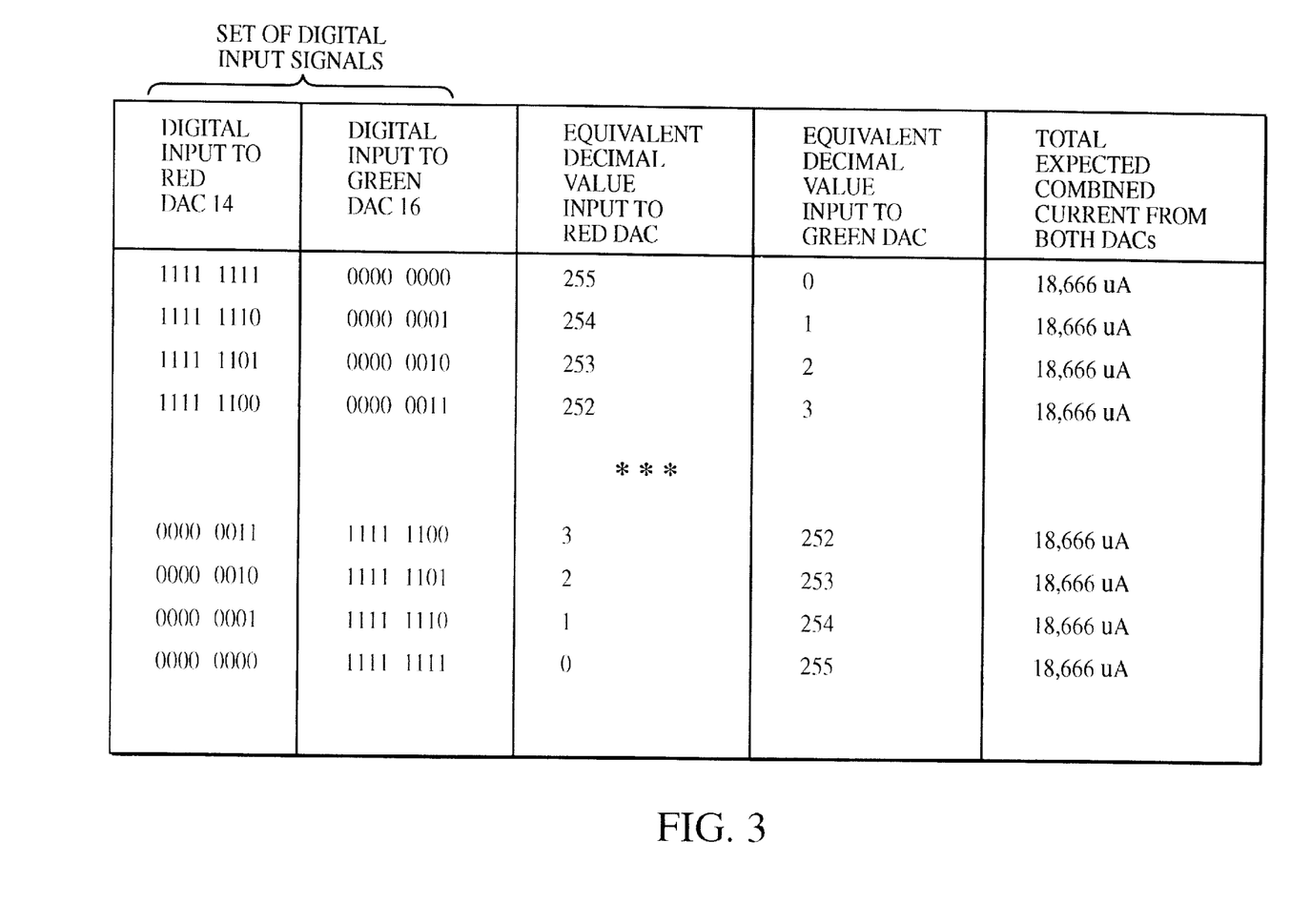
FIG. 3 is a table illustrating exemplary sets of digital input signals.
Figure 4:
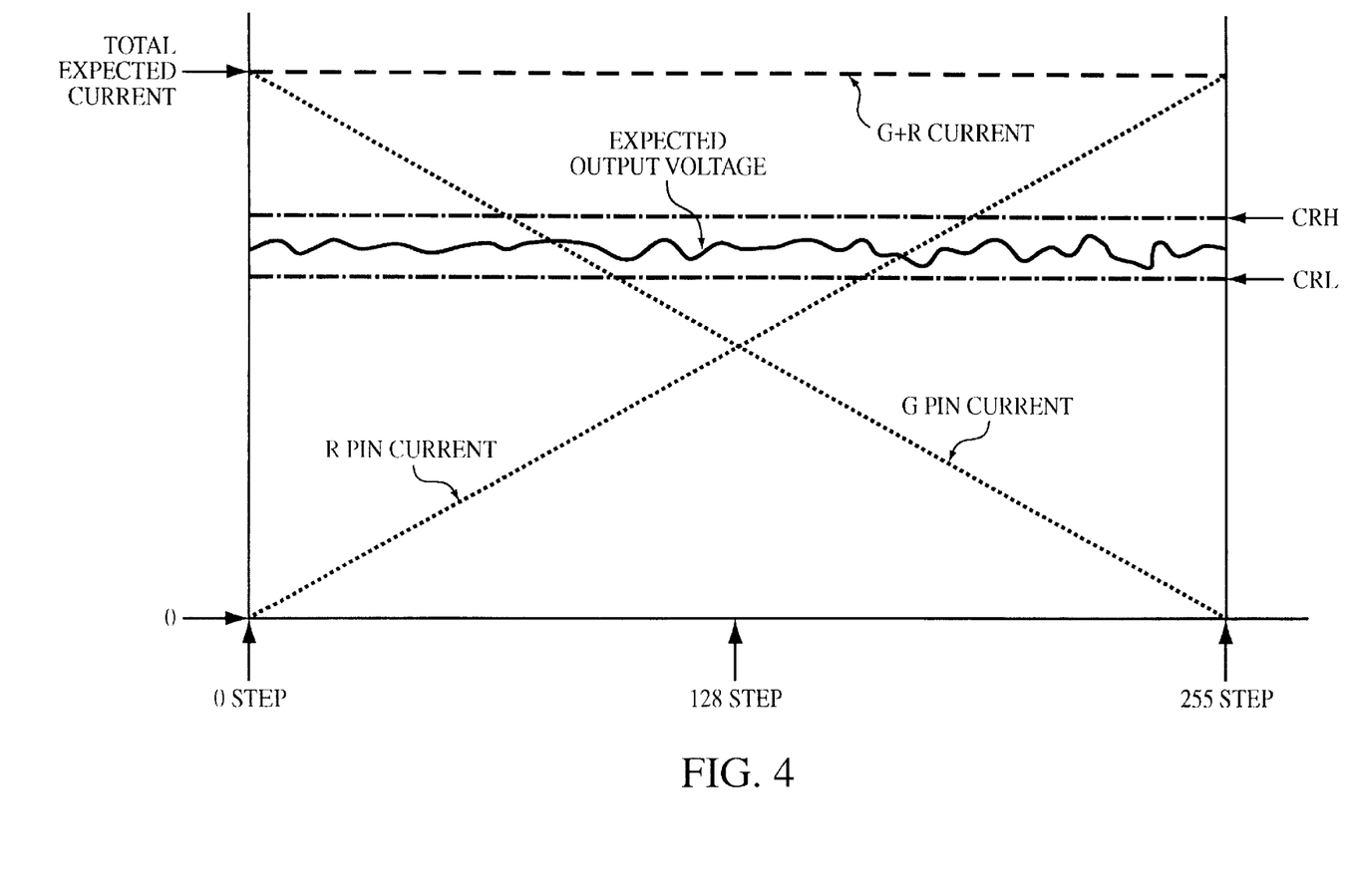
FIG. 4 is a graph illustrating output current and voltage values associated with the digital input signals in FIG. 3.

In one example, it is assumed that the outputs of the red and green DACs 14, 16 initially are coupled together by closing the relay 50A. It also is assumed that the second relay 50B initially remains open so that the output of the blue DAC 18 is not coupled to the outputs of the red and green DACs. FIG. 3 is a table illustrating exemplary values of multiple sets of digital input signals that are generated sequentially by the controller 42 and provided as input signals to the DACs 14, 16. In the illustrated example, the total expected current generated at the output of the DACs 14, 16 is equal to the maximum current that can be generated by a single one of the DACs, in other words, about 18,666 uA. Thus, for example, the first set of digital input signals includes the bits "11111111" as input signals to the red DAC 14 and includes the bits "00000000" as input signals to the green DAC 16. In each subsequent set of digital input signals, the digital value of the 8-bit signal provided to the red DAC 14 is decreased by one, and the digital value of the 8-bit signal provided to the green DAC 16 is increased by one. Thus, the combined expected output current remains substantially the same. In the illustrated example, the last set of digital input signals would include the bits "00000000" as input signals to the red DAC 14 and the bits "11111111" as input signals to the green DAC 16. FIG. 4 graphically illustrates the individual and total expected output currents from the red and green DACs 14, 16 corresponding to the set of input digital signals listed in FIG. 3.

As each set of digital input signals is provided to the DACs 14, 16, the output current signal is converted to a corresponding voltage signal. If the DACs 14, 16 are operating properly, each set of digital input signals should result in a total current output signal of about 18,666 uA, which corresponds to an expected output voltage of about 765 mV. The tester 40 compares the output voltage to the high and low reference voltage levels (CRL, CRH) where CRL is slightly lower than 765 mV and CRH is slightly higher than 765 mV. A general relationship between the expected output voltage and the reference voltage values CRL, CRH is shown in FIG. 4. The particular values on CRL and CRH will depend on the tolerance requirements for the DACS.

In one implementation, if the voltage signal based on the outputs of the DACs 14, 16 is greater than the voltage CRL and less than the voltage CRH, then both comparators 49A, 49B generate corresponding digital high output signals (CMPLO, CMPHI). On the other hand, if the voltage signal based on the outputs of the DACs is less than the voltage CRL or greater than the voltage CRH, one or both of the output signals from the comparators 49A, 49B will be digital low signals. The controller 42 receives the signals CMPLO, CMPHI and determines, based on those signals, whether the output of the DACs 14, 16 corresponding to a particular set of digital input signals is within the required specifications. The process can be repeated for each set of digital input signals by changing the values of the digital input signals (step 108, FIG. 6). If all tests are passed, then the controller 42 can provide an output signal indicating that the DACs 14, 16 meet the established tolerance requirements (step 110). Otherwise, a signal can be provided that at least one of the tests failed (step 112).

If the output signals from the red and green DACs 14, 16 fall within the specified tolerance range for each set of digital input signals, the entire process can be repeated with respect to a second pair of the DACs, for example, the green and blue DACs 16, 18. A signal indicating that the DACs passed all the tests, or that one or more tests failed, can be provided after both pairs of DACs have been tested. Alternatively, if a test fails, a signal indicating the failure can be provided immediately, and further testing can be terminated.

In some implementations, instead of consecutively testing two pairs of DACs to determine whether the outputs of all three DACs meet the required specifications, a single sequence of multiple sets of digital input signals can be used. In that case, both relays 50A, 50B are closed so that the outputs of all three DACs 14, 16, 18 are coupled together. As before, sets of digital input signals are provided so that the combined expected current from the three DACs 14, 16, 18 is equal to a predetermined value, for example, 18,666 uA. The resulting combined output current is converted to a corresponding voltage signal that can be compared to appropriate reference voltage values CRL, CRH.

Figure 5:
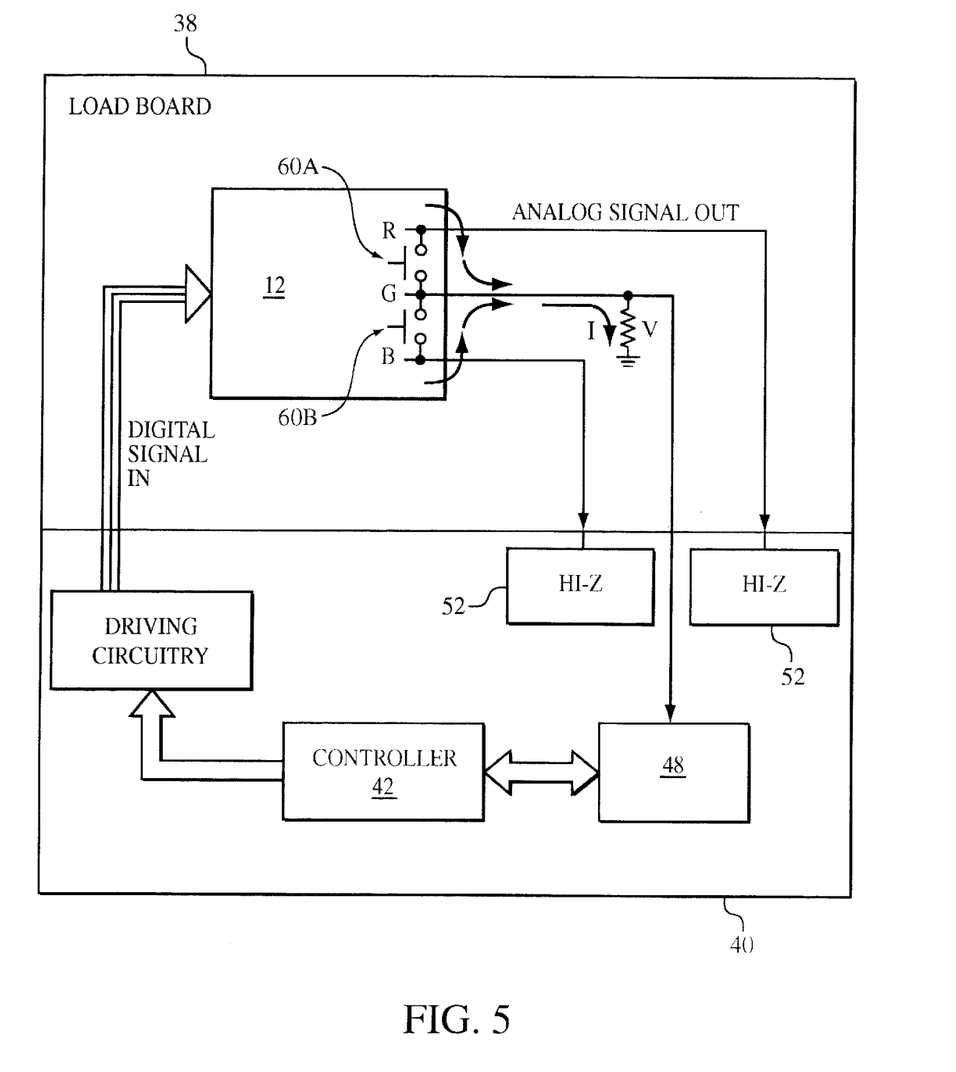
FIGS. 5 and 6 illustrate alternative arrangements for testing the DACs according to the invention.
Figure 6:
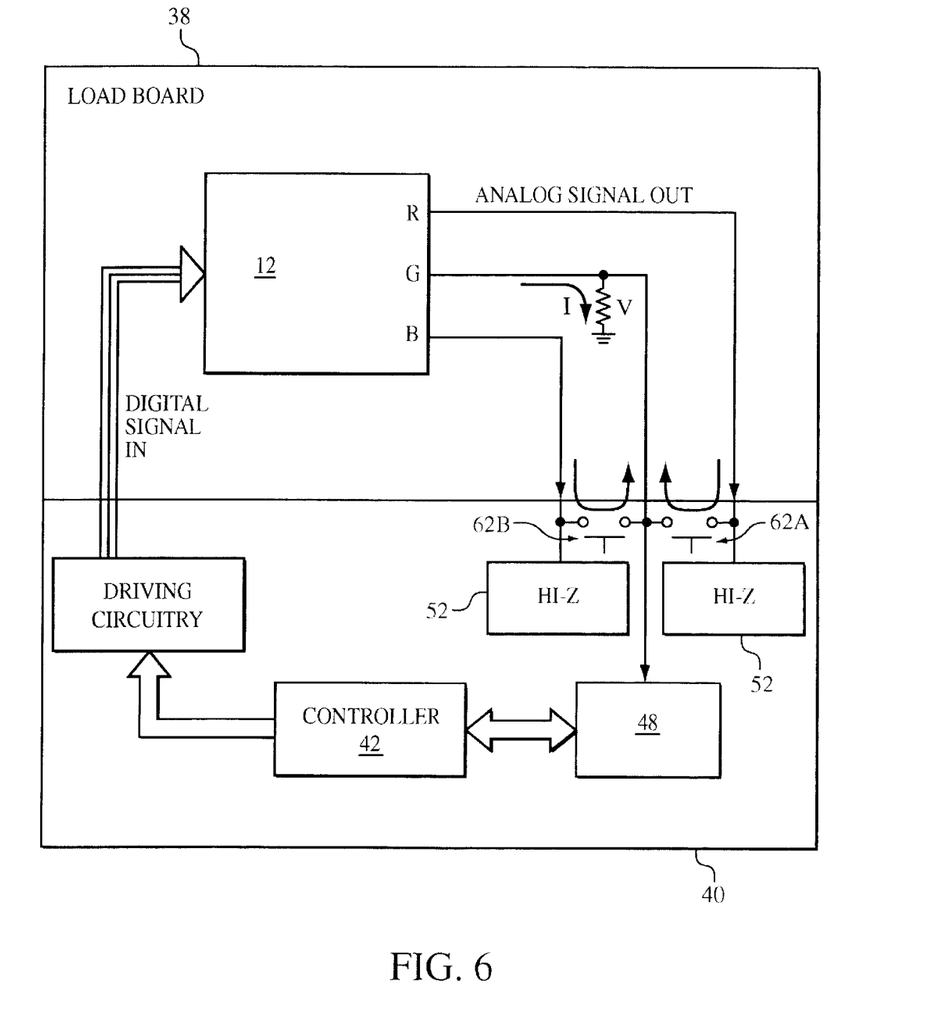

The individual output current signals from the DACs 14,16 18 can be coupled together in other ways as well. For example, instead of providing relays 50A, 50B on the load board 38 (FIG. 2), relays 60A, 60B can be provided internally as part of the display controller 12 (FIG. 5). Such relays can be implemented, for example, as MOS-type relays. According to another implementation, the outputs of the DACs can be coupled together by providing relays 62A, 62B on the tester 40 as shown in FIG. 6. In yet other implementations, the output pins of the DACs can be connected together permanently on the lead board 38 or the tester 40. Such implementations eliminate the need for the relays; however, they provide less versatility.

In some situations, it may be desirable to test only a limited range of the possible digital input signals. For example, depending on the range and accuracy of the tester 40, the least significant bit or the most significant bit for each DAC can be set to '0' during testing.

Although the foregoing description assumes that the display controller 12 includes three DACs, the techniques described above can be used to test display controllers that include more than three DACs and as few as two DACs. Similarly, the foregoing techniques can be used to test other devices that include two or more DACs.

Comparing the output voltage signals to reference values using the comparator circuit 48 rather than performing the comparisons in software can increase the speed at which the tests are executed. By selecting combinations of digital input signals that are expected to result in a substantially constant total DAC output current, only a single comparator circuit 48 is needed. Although it often will be preferable to perform the comparisons in hardware, in alternative implementations, the functions performed by the comparator circuit 48 can be performed in software. In general, the foregoing techniques can provide a fast, efficient method for testing multiple DACs over a wide range of possible input signals. The techniques described above can be used alone or in conjunction with other techniques for testing DACs.

Other implementations are within the scope of the following claims.

What is claimed is:

1. A method comprising:
   providing a set of digital input signals to digital-to-analog converters;
   combining a respective current output signal from each of the digital-to-analog converters into a single current signal;
   comparing the signal corresponding to the combined current signal to high and low reference signals; and
   determining whether the signal corresponding to the resulting combined output current signal falls within a range defined by the high and low reference signals.

2. The method of claim 1 including providing multiple sets of digital input signals in sequence to the digital-to-analog converters, wherein the acts of comparing a resulting combined output signal and determining whether the resulting combined output signal is within a predetermined tolerance are performed with respect to each set of digital input signals.

3. The method of claim 1 including converting the single combined current signal to a corresponding voltage signal.

4. The method of claim 3 wherein the comparing includes comparing the corresponding voltage signal to high and low reference voltage signals.

5. The method of claim 1 including providing a signal indicative of whether the signal corresponding to the combined current signal is within the range.

6. The method of claim 1 wherein outputs of three digital-to-analog converters are combined to obtain the combined current signal.

7. A method of testing digital-to-analog converters, the method comprising:
   providing multiple sets of digital input signals in sequence to the digital-to-analog converters;
   combining, for each set of digital input signals, a respective current output signal from each of the digital-to-analog converters into a single current signal;
   comparing, for each set of digital input signals, a signal corresponding to the combined current signal to first and second values; and
   determining, for each set of digital input signals, whether the signal corresponding to the combined current signal meets predetermined specifications defined by the first and second values.

8. The method of claim 7 including converting the single combined current signal to a corresponding voltage signal.

9. The method of claim 8 wherein the comparing includes comparing the corresponding voltage signal to high and low reference voltage signals.

10. The method of claim 7 including providing a signal indicative of whether the signal corresponding to the combined current signal is within the established tolerances for each set of digital input signals.

11. The method of claim 7 including providing a signal indicative of whether the signal corresponding to the combined current signal for at least one set of digital input signals fails to meet the established tolerances.

12. The method of claim 7 wherein, for each set of digital input signals, the combined current signal is substantially equal to a predetermined value when the digital-to-analog converters meet the predetermined specifications.

13. The method of claim 12 wherein the predetermined value corresponds to a maximum output signal from a single one of the digital-to-analog converters.

14. The method of claim 7 wherein providing sets of digital input signals includes providing all combinations of digital input signals for which the combined current signal from the digital-to-analog converters is substantially equal to a predetermined value when the digital-to-analog converters meet the predetermined specifications.

15. A method of testing digital-to-analog converters, the method comprising:

providing multiple sets of digital input signals in sequence to the digital-to-analog converters, wherein, for each set of digital input signals, an expected combined output current signal from the digital-to-analog converters approximately equals a predetermined value;

converting, for each set of digital input signals, a resulting combined output current signal from the digital-to-analog converters to a corresponding voltage signal;

comparing, for each set of digital input signals, the voltage signal to first and second reference voltage values; and determining, for each set of digital input signals, whether the resulting combined output current signal is within predetermined tolerances based on the comparing.

16. The method of claim 15 including combining a respective current output signal from each of the digital-to-analog converters into a single current signal.

17. The method of claim 16 wherein the comparing includes comparing a resulting combined output signal to high and low reference values.

18. An apparatus for testing a device including a plurality of digital-to-analog converters, the apparatus comprising:

a plurality of drivers that provide a set of digital input signals to the plurality of digital-to-analog converters;

a channel arranged to receive a resulting combined current signal from the plurality of digital-to-analog converters;

a comparator circuit arranged to receive a signal corresponding to the combined current signal from the channel and arranged to compare the signal corresponding to the combined current signal to first and second reference signals; and a controller to cause the drivers to provide a set of digital input signals to the plurality of digital-to-analog converters and arranged to receive output signals from the comparator circuit, wherein the controller determines whether the signal corresponding to the combined output signal is within pre-established tolerances converters based on the signals received from the comparator circuit.

19. The apparatus of claim 18 including a relay that can selectively be positioned to couple together output signals from a group of the digital-to-analog converters.

20. The apparatus of claim 18 including a plurality of relays each of which can selectively be positioned to couple together output signals from a respective group of the digital-to-analog converters.

21. An article comprising a computer-readable medium comprising computer-executable instructions including the following:

control a plurality of drivers to provide a set of digital input signals to digital-to-analog converters;

compare a signal corresponding to a combined current signal, that is based on outputs from the digital-to-analog converters, to high and low reference values; and determine whether the signal corresponding to the combined current signal is within a range defined by the reference values.

22. An apparatus for testing a device including a plurality of digital-to-analog converters, the apparatus comprising:

a plurality of drivers that provide a set of digital input signals to the plurality of digital-to-analog converters;

a channel to receive a combined current signal based on outputs from the plurality of digital-to-analog converters;

a comparator circuit to receive a signal corresponding to the combined current signal from the channel and arranged to compare the signal corresponding to the combined current signal to first and second reference signals; and a controller to cause the drivers to provide sequential sets of digital input signals to the plurality of digital-to-analog converters and arranged to receive output signals from the comparator circuit, wherein the controller determines whether the signal corresponding to the combined output signal is within pre-established tolerances converters based on the signals received from the comparator circuit.

23. The apparatus of claim 22 including a relay that can selectively be positioned to couple together output signals from a group of the digital-to-analog converters.

24. The apparatus of claim 23 including a resistive element to convert a combined current signal from the plurality of digital-to-analog converters to a corresponding voltage signal.

25. The apparatus of claim 22 wherein the controller causes the drivers to provide each set of digital input signals so that the combined current signal from the plurality of digital-to-analog converters equals approximately a predetermined value when the digital-to-analog converters are operating within the pre-established tolerances.

26. An article comprising a computer-readable medium comprises computer-executable instructions including the following:

control a plurality of drivers to provide a set of digital input signals to digital-to-analog converters;

compare a signal corresponding to a combined current signal, that is based on outputs from the digital-to-analog converters, to high and low reference values; and determine whether the signal corresponding to the combined current signal is within a range defined by the reference values.

* * * * *